(12) United States Patent
Sakakibara

(10) Patent No.: US 7,764,548 B2
(45) Date of Patent: Jul. 27, 2010

(54) SEMICONDUCTOR MEMORY DEVICE WHICH DELAYS REFRESHMENT SIGNAL FOR PERFORMING SELF-REFRESHMENT

(75) Inventor: Kenichi Sakakibara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 34 days.

(21) Appl. No.: 12/314,748

(22) Filed: Dec. 16, 2008

(65) Prior Publication Data

US 2009/0161456 A1    Jun. 25, 2009

(30) Foreign Application Priority Data

Dec. 21, 2007   (JP) ............................. P2007-331149

(51) Int. Cl.
 *G11C 16/06* (2006.01)
(52) U.S. Cl. .................. 365/185.25; 365/222
(58) Field of Classification Search ............ 365/185.25, 365/222
See application file for complete search history.

(56) References Cited

U.S. PATENT DOCUMENTS

2004/0008544 A1 * 1/2004 Shinozaki et al. ...... 365/189.05

FOREIGN PATENT DOCUMENTS

JP    9-7367    1/1997

* cited by examiner

*Primary Examiner*—Hoai V Ho
*Assistant Examiner*—Jason Lappas
(74) *Attorney, Agent, or Firm*—McGinn IP Law Group, PLLC

(57) ABSTRACT

A semiconductor memory device having two refreshment modes of auto-refreshment and partial self-refreshment imposed on memory cells includes a command decoder which detects one of the refreshment modes from an input command, outputs type data which indicates the detected refreshment mode, and outputs a refreshment signal which indicates the start of refreshment; a mode register in which the type data is set; a signal selection circuit which determines whether or not the refreshment signal is to be delayed, in accordance with the type data set in the mode register, and outputs the refreshment signal, which is delayed or not delayed in accordance with the result of the determination, as a refreshment start signal; and a control circuit which reads the type data set in the mode register based when receiving the refreshment start signal, and performs refreshment corresponding to the type data.

4 Claims, 4 Drawing Sheets

SEMICONDUCTOR MEMORY DEVICE WHICH DELAYS REFRESHMENT SIGNAL FOR PERFORMING SELF-REFRESHMENT

BACKGROUND OF THE INVENTION

1. Field of the Invention

The present invention relates to a semiconductor memory device, and in particular, relates to a semiconductor memory device which performs self-refreshment.

Priority is claimed on Japanese Patent Application No. 2007-331149, filed Dec. 21, 2007, the contents of which are incorporated herein by reference.

2. Description of Related Art

In recent years, a semiconductor memory device (DRAM) has been used in a portable data terminal. In a portable data terminal, the power voltage is supplied from a battery. Therefore, in order to use the terminal continuously for a long time, it is necessary to reduce the power consumption as much as possible (see for example, Japanese Unexamined Patent Application, First Publication No. H09-7367).

That is, a semiconductor memory device as shown in FIG. 5 has been put to practical use, and not only has an auto-refreshment function for refreshing memory cells of the entire memory area in the semiconductor memory device, but also has a partial self-refreshment (called "self-refreshment" below) function in which a target memory area (e.g., a bank) for refreshment can be determined so as to further reduce the power consumption in consideration of the use of the semiconductor memory device in a portable data terminal.

Therefore, the semiconductor memory device has two refreshment modes: auto-refreshment and self-refreshment.

In the conventional semiconductor memory device, a command decoder 2 interprets a command from an external device, and writes type data, which indicates the refreshment mode, in a mode register 3, so as to enter the refreshment mode.

The present inventor has recognized that when the type data is written and set in the mode register 3, there is a delay from the writing of the type data to the output of the set type data.

When the command decoder 2 detects the type data of refreshment by means of a refreshment command input from an external device, the command decoder 2 performs the setting of the type data to the mode register 3 and the output of a refreshment signal MREF to a control circuit 4 synchronously.

When the output timing of the type data from the mode register 3 to the control circuit 4 is delayed from the input timing of the refreshment signal MREF into the control circuit 4 by a delay time from the input to the output of the type data at the mode register 3, then the refreshment signal MREF is input into the control circuit 4 before the setting of the mode register 3 is communicated to the control circuit 4.

Therefore, when the refreshment mode is entered, type data which indicates the auto-refreshment is set in the control circuit 4, and the refreshment mode of the auto-refreshment is effective until the auto-refreshment is completed and the next command for performing the self-refreshment is entered.

Therefore, the refreshment mode is switched from the auto-refreshment to the self-refreshment after all memory cells of the semiconductor memory device are subjected to the auto-refreshment at least once, that is, after at least one cycle of the relevant refreshment process is completed.

In the above-described structure, even when a refreshment command for switching the refreshment mode from auto-refreshment to self-refreshment is input during the auto-refreshment, the control circuit 4 cannot switch the refreshment mode to the self-refreshment until the refreshment of all memory cells of the semiconductor memory device is completed.

Therefore, the present inventor has recognized that in the conventional semiconductor memory device, even when a refreshment command for switching the refreshment mode from auto-refreshment to self-refreshment is input during the auto-refreshment:

(i) target memory cells for self-refreshment are not refreshed for a long period of time (especially, in a synchronous-type semiconductor memory device having a direct auto-refreshment function); and (ii) the refreshment mode is not switched to self-refreshment until the refreshment of all memory cells are completed, and thus no current-reduction effect for a target memory area for refreshment is obtained immediately after the self-refreshment mode is entered.

SUMMARY

The present invention seeks to solve one or more of the above problems, or to improve upon those problems at least in part.

In one embodiment, there is provided a semiconductor memory device having two refreshment modes of auto-refreshment and partial self-refreshment imposed on memory cells. The semiconductor memory device includes a command decoder which detects one of the refreshment modes from an input command, outputs type data which indicates the detected refreshment mode, and outputs a refreshment signal which indicates the start of refreshment; a mode register in which the type data is set; a signal selection circuit which determines whether or not the refreshment signal is to be delayed, in accordance with the type data set in the mode register, and outputs the refreshment signal, which is delayed or not delayed in accordance with the result of the determination, as a refreshment start signal; and a control circuit which reads the type data set in the mode register based when receiving the refreshment start signal, and performs refreshment corresponding to the type data.

In accordance with the present invention, even when a delayed refreshment start signal for (partial) self-refreshment is input into the control circuit which performs any one of the self-refreshment and auto-refreshment, the refreshment start signal (generated by delaying the refreshment signal) is input into the control circuit after the type data for indicating the self-refreshment is set in the mode register and the type data to be input from the mode register into the control circuit is changed. Therefore, the result that the refreshment mode has been entered is reliably communicated to the control circuit, and the self-refreshment starts at the time when the self-refreshment is entered. Accordingly, it is possible to reduce power consumption, and prevent occurrence of memory cells which are not refreshed.

Therefore, in the present invention, when switching the refreshment mode from auto-refreshment to self-refreshment, the determination timing (for reading the type data from the mode register) of the control circuit is shifted (i.e., delayed) so that refreshment does not start in the auto-refreshment mode. Therefore, it is possible to prevent the auto-refreshment from starting when the self-refreshment mode is entered.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
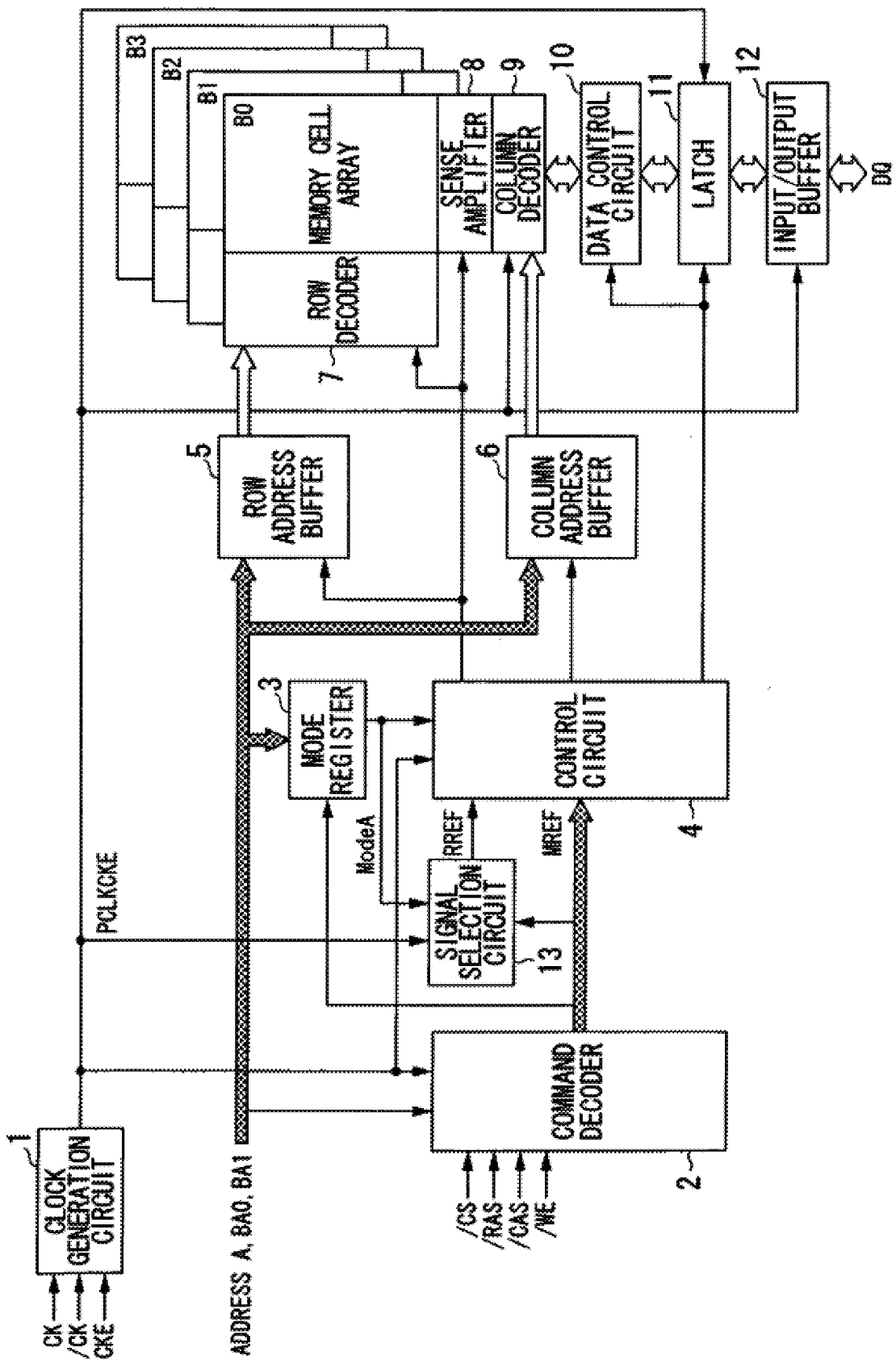
FIG. 1 is a block diagram showing a semiconductor memory device according to a first embodiment of the present invention.
Figure 5:
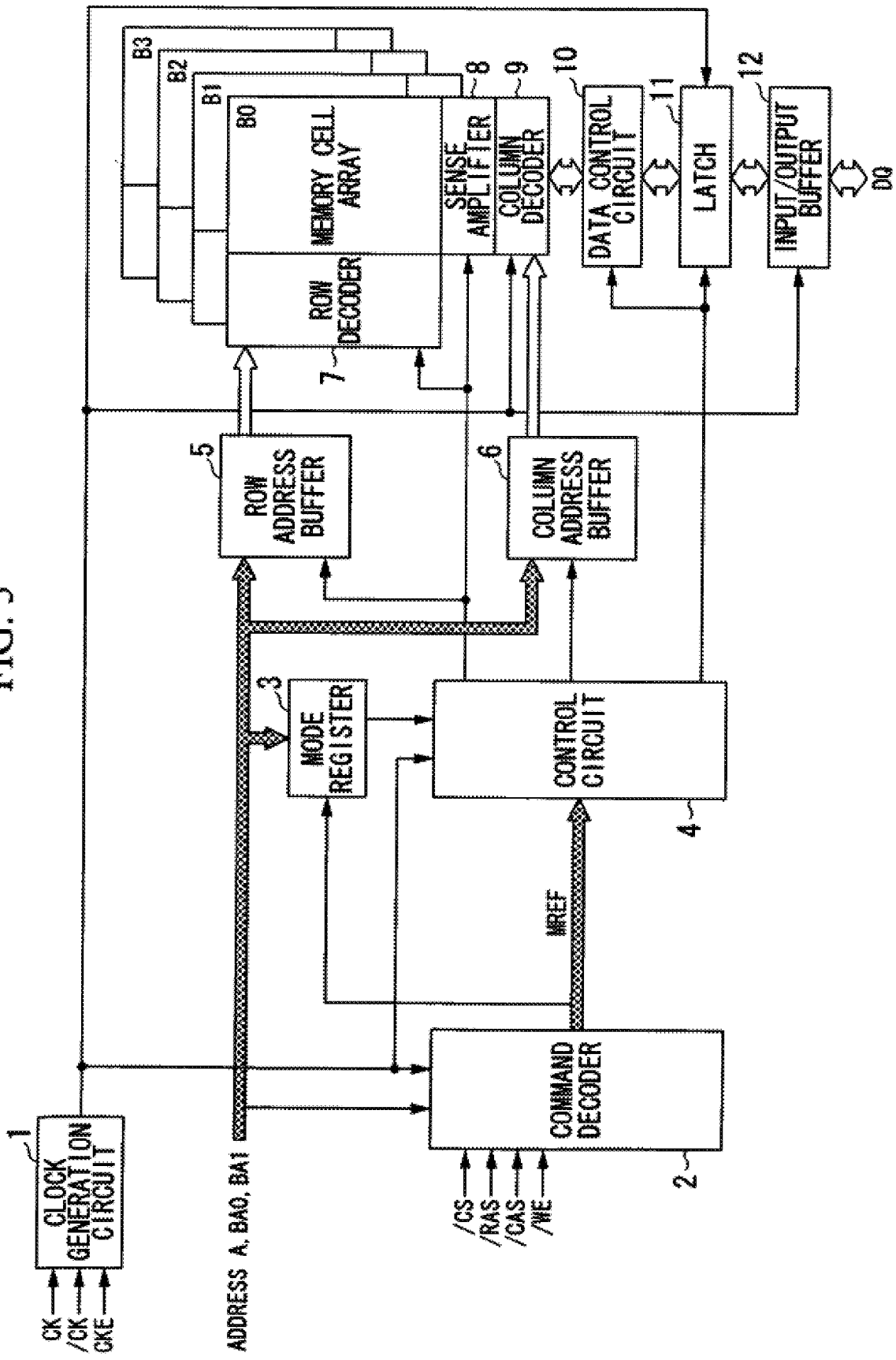
FIG. 5 is a block diagram showing an example of a conventional semiconductor memory device.

FIG. 1 shows a semiconductor memory device according to a first embodiment of the present invention. In FIG. 1, parts identical to those in FIG. 5 are given identical reference numerals, and explanations thereof are omitted. In comparison with FIG. 5, the first embodiment has a distinctive feature of including a signal selection circuit 13.

That is, the semiconductor memory device of the present embodiment has a clock generation circuit 1, a command decoder 2, a mode register 3, a control circuit 4, a row address buffer 5, a column address buffer 6, row decoders 7, sense amplifiers 8, column decoders 9, a data control circuit 10, a latch 11, an input/output buffer 12, and a signal selection circuit 13.

The clock generation circuit 1 generates an enable signal PCLKCKE, which is used for generating a refreshment signal MREF, by using a clock signal CK, a clock signal /CK (i.e., inverse signal of CK), and a clock enable signal CKE, which are input from an external device, and outputs the generated signal to the command decoder 2 and the signal selection circuit 13.

The command decoder 2 detects the operation type (i.e., reading, writing, or type of refreshment) by means of command signals such as /CS, /RAS, /CAS, and /WE, which are input from an external device. The command decoder 2 outputs the detected result to each relevant circuit. When a refreshment command is input, the command decoder 2 writes type data, which indicates the type of refreshment mode, into the mode register 3, and outputs the refreshment signal MREF in synchronism with the enable signal PCLKCKE. In this process, the command decoder 2 outputs the type data and the refreshment signal MREF synchronously.

The mode register 3 latches and stores the type data output from the command decoder 2, and outputs the stored type data into the control circuit 4 and the signal selection circuit 13.

Based on the above-described type data, the signal selection circuit 13 determines whether the refreshment signal MREF, input from the command decoder 2, is directly output without delay, or the refreshment signal MREF is output after delaying it by means of an internal delay circuit thereof.

When the type data indicates self-refreshment, the refreshment signal MREF is delayed and output as a refreshment start signal RREF. When the type data indicates auto-refreshment, the refreshment signal MREF is not delayed and also output as a refreshment start signal RREF.

Based on the refreshment start signal RREF input from the signal selection circuit 13, the control circuit 4 reads the type data output from the mode register 3, and performs refreshment of memory cell arrays (banks B0, B1, B2, and B3) in accordance with the refreshment mode corresponding to the type data.

As address signals, an address signal A (for a column address and a row address) and address signals BA0 and BA1 are input from an address buffer (not shown).

Based on the address signals BA0 and BA1, any one of the banks B0, B1, B2, and B3 is selected by a bank address decoder (not shown). In each bank, memory cells are arranged at intersections provided by a plurality of word lines, one of which is selected by the row address, and a plurality of bit lines, one of which is selected by the column address.

In (partial) self-refreshment, one or more target banks, for which refreshment is necessary, can be designated to the command decoder 2, so that only selected bank(s) among all banks can be subjected to the refreshment, thereby reducing power consumption.

The row address buffer 5 selects a word line in the relevant bank, in response to the row address input from an external device. During a refreshment cycle, the row address buffer 5 performs increment of the row address (i.e., increases the address one by one) by using an internal counter thereof, so as to select each word line to perform refreshment of each memory cell.

The column address buffer 6 selects a bit line in the relevant bank, in response to the column address input from an external device. During a refreshment cycle, the column address buffer 6 increments the column address (i.e., increases the address one by one) by using an internal counter thereof, so as to select each bit line so as to perform refreshment of each memory cell.

The row decoder 7 is provided in each of the banks B0, B1, B2, and B3, and selects a word line corresponding to the row address input from the row address buffer 5.

The column decoder 9 is provided in each of the banks B0, B1, B2, and B3, and selects a bit line corresponding to the column address input from the column address buffer 5.

Selection of the sense amplifiers 8 is performed using the column address. The selected sense amplifier amplifies the voltage difference between the bit line, onto which data stored in the relevant memory cell is output, and the bit line of a reference potential, so as to read the data stored in the memory cell. In order to refresh each memory cell, the sense amplifier 9 reads the data of the selected memory cell and then writes the data into the memory cell again.

The data control circuit 10 controls writing and reading of data. In data writing, the data control circuit 10 temporarily stores data, which is input from the input/output buffer 12, into the latch 11, and then writes the data into the relevant memory cell via the column decoder 9 and the sense amplifier 8. In data reading, the data control circuit 10 temporarily stores data, which is read from the relevant memory cell via the sense amplifier 8 and the column decoder 9, into the latch 11, and then outputs the data through the input/output buffer 12.

Figure 2:
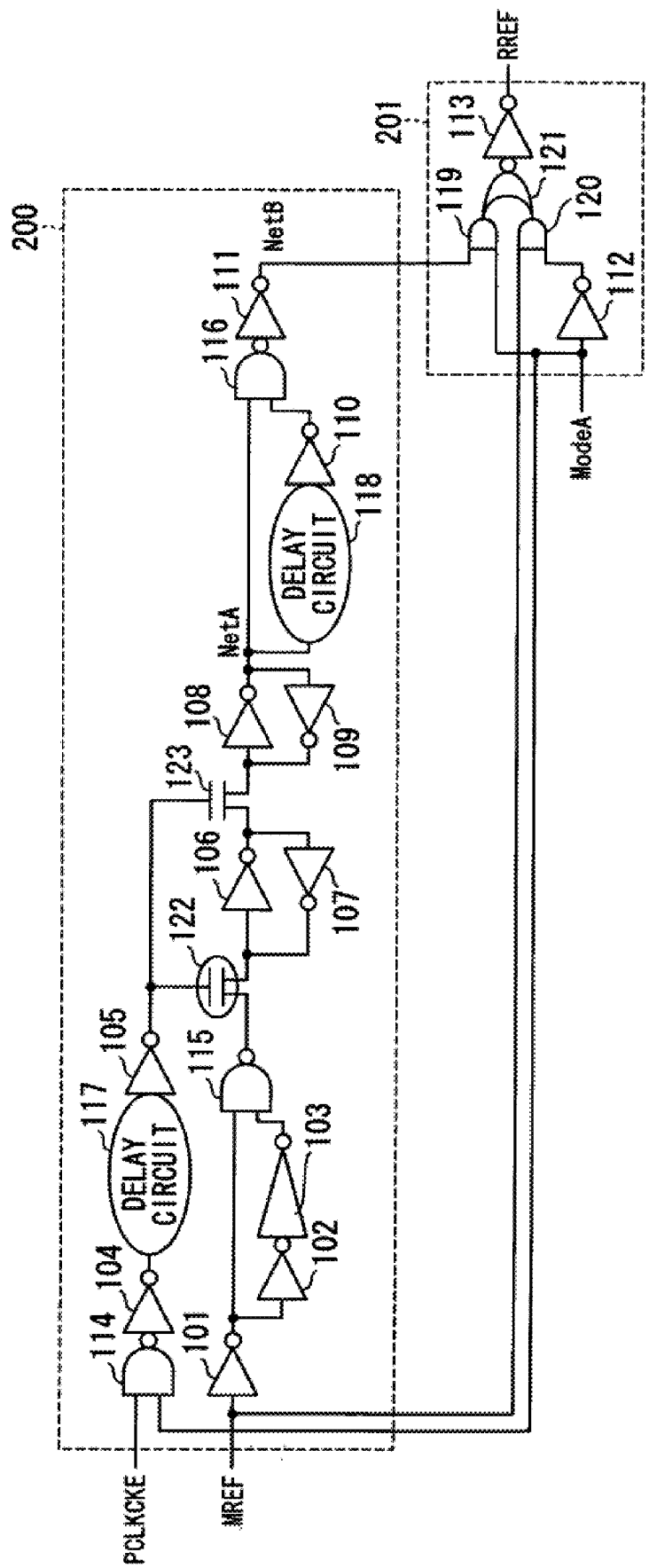
FIG. 2 is a schematic diagram showing an example of the structure of the signal selection circuit 13 in FIG. 1.

Next, the signal selection circuit 13 of the present embodiment in FIG. 1 will be further explained with reference to FIG. 2, which is a schematic diagram showing an example of the structure of the signal selection circuit 13.

That is, the signal selection circuit 13 consists of a delay part 200 for delaying the refreshment signal MREF, and a selection part 201 for determining whether (i) the delayed refreshment signal MREF, which has been delayed by (or passed thorough) the delay part 200, or (ii) the refreshment signal MREF, which has not passed through (i.e., not been delayed by) the delay part 200, is to be output in accordance with the type data "ModeA".

That is, when the refreshment mode indicates self-refreshment, the refreshment start signal, which is input into the control circuit 4, is delayed.

The delay part 200 includes inverters 101 to 111, NAND circuits 114 to 116, delay circuits 117 and 118, a p-channel MOS transistor 122, and an n-channel MOS transistor 123.

The selection part 201 includes inverters 112 and 113, AND circuits 119 and 120, and a NOR circuit 121.

As an example, it is assumed that (i) when the type data ModeA, which is input from the mode register 3, is an H-level signal, the refreshment mode is self-refreshment (i.e., the refreshment signal MREF is delayed), and (ii) when the type data ModeA is an L-level signal, the refreshment mode is auto-refreshment (i.e., the refreshment signal MREF is not delayed).

When the enable signal PCLKCKE is input and the input type data ModeA is the H-level signal, the delay part 200 latches the refreshment signal MREF, which is in synchronism with the enable signal PCLKCKE, so as to delay the refreshment signal MREF in a manner such that the refreshment signal MREF is output after the output of the enable signal PCLKCKE is completed (i.e., after the relevant H-level pulse period is completed).

When the type data ModeA is the H-level signal, the selection part 201 selects the delayed refreshment signal MREF and outputs it as the refreshment start signal RREF. In contrast, when the type data ModeA is an L-level signal, the selection part 201 selects the non-delayed refreshment signal MREF and outputs it as the refreshment start signal RREF.

Figure 3:
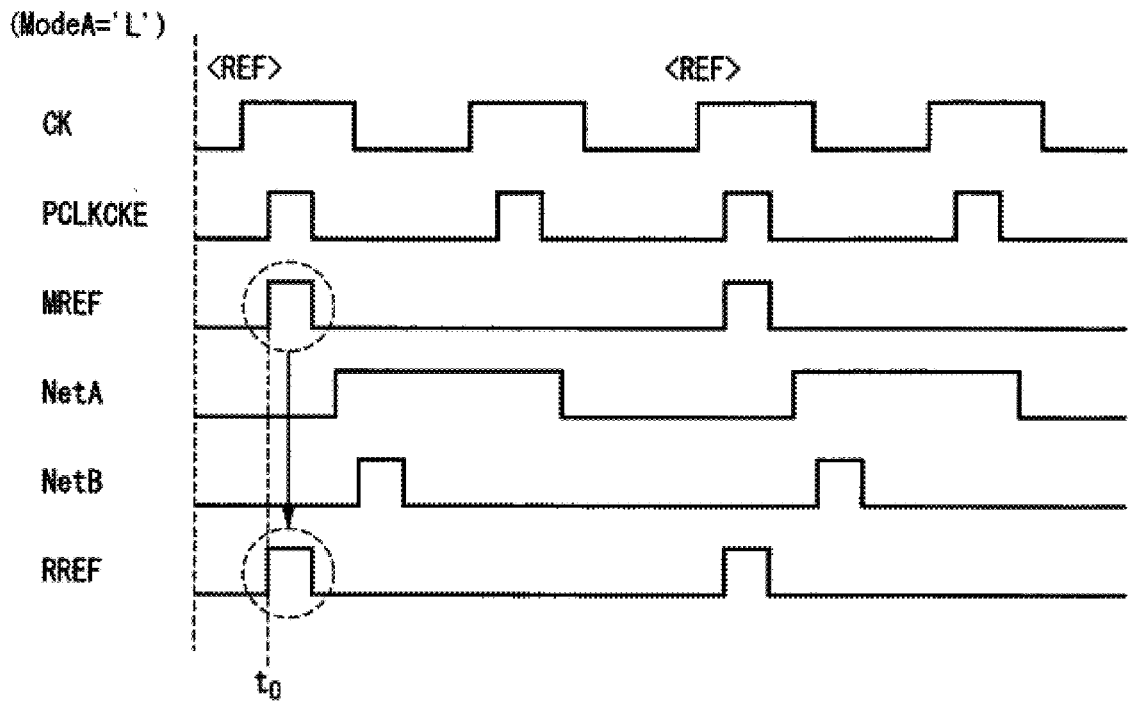
FIG. 3 is a schematic diagram showing an operation when the refreshment mode is auto-refreshment.
Figure 4:
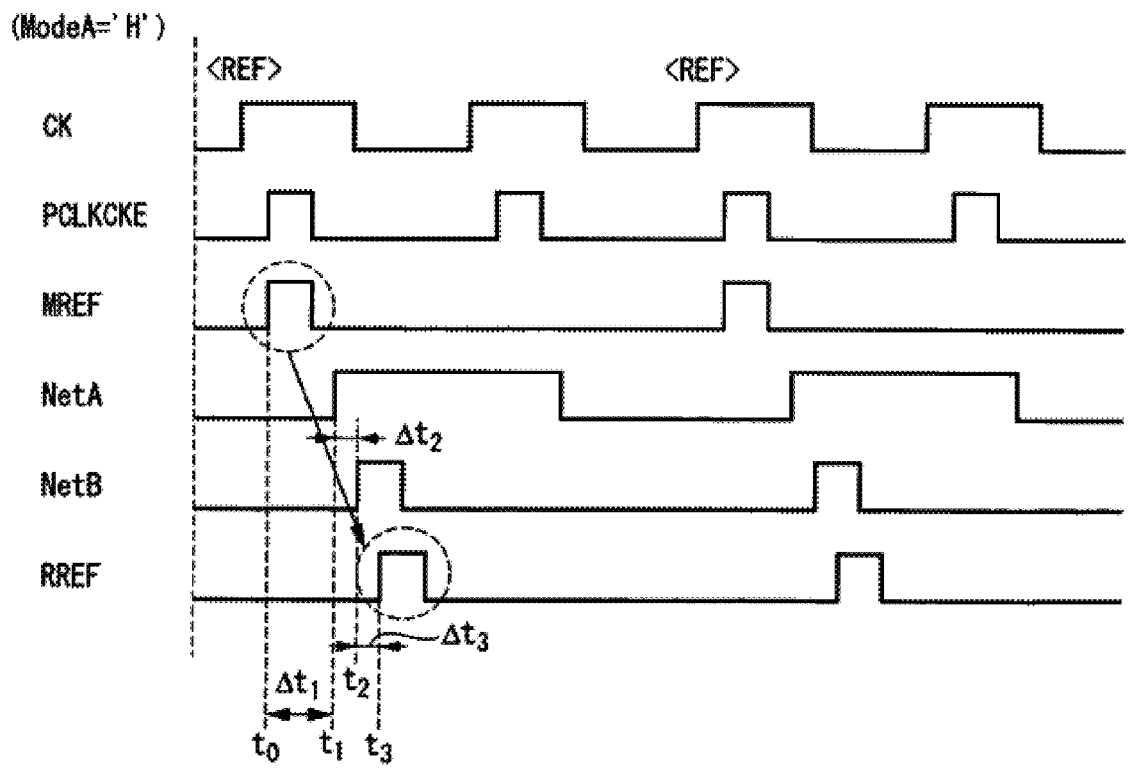
FIG. 4 is a schematic diagram showing an operation when the refreshment mode is self-refreshment.

The operation of the signal selection circuit 13 will be explained with reference to FIGS. 3 and 4, which are timing charts for showing examples of the operation of the signal selection circuit 13 in FIG. 2. At the start of the timing charts, auto-refreshment has been selected as the refreshment mode, and thus the type data (stored in the mode register 3) of the refreshment mode is the L-level signal which indicates the auto-refreshment.

In Case That Auto-Refreshment Mode is Entered

When a command which designates auto-refreshment is input in synchronism with the clock signal CK and the enable signal PCLKCKE is also input at time t0, the command decoder 2 outputs the refreshment signal MREF, and writes the type data ModeA, which is the L-level signal, into the mode register 3.

The delay part 200, into which the enable signal PCLKCKE and the refreshment signal MREF are input, delays the refreshment signal MREF by means of the relevant pulse of the enable signal PCLKCKE.

However, the type data ModeA, which is input as the selection signal, is the L-level signal, the selection part 201 outputs the non-delayed refreshment signal MREF as the refreshment start signal RREF.

When the refreshment start signal RREF is input into the control circuit 4, the control circuit 4 reads the type data ModeA which is the L-level signal, which is stored in the mode register 3, and starts the auto-refreshment operation by driving the row address buffer 5, the column address buffer 6, and the sense amplifier 8.

In Case That Self-Refreshment (Partial Self-Refreshment) Mode is Entered

When a command which designates self-refreshment is input in synchronism with the clock signal CK and the enable signal PCLKCKE is also input at time t0, the command decoder 2 outputs the refreshment signal MREF, and writes the type data ModeA, which is the H-level signal, into the mode register 3.

The delay part 200, into which the enable signal PCLKCKE and the refreshment signal MREF are input, delays the refreshment signal MREF by means of the relevant pulse of the enable signal PCLKCKE.

As the type data ModeA, which is input as the selection signal, is the H-level signal, the selection part 201 should output the delayed refreshment signal MREF (delayed by the delay part 200) as the refreshment start signal RREF.

However, the delay part 200 is now under the operation of delaying the refreshment signal MREF, and thus has not yet output the refreshment start signal RREF.

At time t1, the delayed refreshment signal MREF is transmitted to a node "NetA". That is, the level of the node NetA is changed from "L" to "H" when the delay time Δt1 of the delay circuit 117 has elapsed.

At time t2, the level of the node NetA is transmitted to a node "NetB" after a delay is provided. That is, the level of the node NetB is changed from "L" to "H" when the delay time Δt2 of the delay circuit 118 has elapsed.

At time t3, the selection part 201 outputs the signal output from the delay part 200, that is, the level change from "L" to "H" of the node NetB, as the refreshment start signal RREF when the delay time Δt3 of the selection part 201 has elapsed.

When the refreshment start signal RREF is input into the control circuit 4, the control circuit 4 reads the type data, which is the H-level signal and is stored in the mode register 3, and starts the self-refreshment operation of one or more banks, which have been determined in synchronism with the input of the refreshment command, by driving the row address buffer 5, the column address buffer 6, and the sense amplifier 8.

In accordance with the above structure, when a refreshment command for designating self-refreshment is input into the semiconductor memory device of the present embodiment, the input of the refreshment start signal RREF into the control circuit 4 is delayed by a time necessary for changing the setting of the mode register 3 into the relevant refreshment mode (designated by an external device). Therefore, the refreshment operation starts after the setting of the mode register 3 is changed.

Accordingly, it is possible to solve a conventional problem in which even when the self-refreshment mode is entered, the auto-refreshment mode is performed at the same time.

That is, it is possible to prevent (i) generation of bits which are not refreshed for a long period of time even when the relevant refreshment mode is entered, and (ii) non-execution of current reduction, due to a difference in addressing for performing refreshment between auto-refreshment and self-refreshment.

It is apparent that the present invention is not limited to the above embodiments, but may be modified and changed without departing from the scope and spirit of the invention.

What is claimed is:

1. A semiconductor memory device having two refreshment modes of auto-refreshment and partial self-refreshment imposed on memory cells, the device comprising:
   a command decoder which detects one of the refreshment modes from an input command, outputs type data which indicates the detected refreshment mode, and outputs a refreshment signal which indicates the start of refreshment;

a mode register in which the type data is set;

a signal selection circuit which determines whether or not the refreshment signal is to be delayed, in accordance with the type data set in the mode register, and outputs the refreshment signal, which is delayed or not delayed in accordance with the result of the determination, as a refreshment start signal; and
   a control circuit which reads the type data set in the mode register based when receiving the refreshment start signal, and performs refreshment corresponding to the type data.

2. The semiconductor memory device in accordance with claim 1, wherein:
   when the type data indicates the auto-refreshment, the signal selection circuit outputs the non-delayed refreshment signal as the refreshment start signal; and
   when the type data indicates the partial self-refreshment, the signal selection circuit outputs the delayed refreshment signal as the refreshment start signal.

3. The semiconductor memory device in accordance with claim 2, wherein:
   the signal selection circuit has a delay time used when the type data indicates the partial self-refreshment, by which the refreshment signal is output as the refreshment start signal after the output of the refreshment signal from the command decoder is completed.

4. The semiconductor memory device in accordance with claim 1, wherein the signal selection circuit includes:
   a delay part for delaying the refreshment signal; and
   a selection part for determining whether the delayed refreshment signal, which has been delayed by the delay part, or the non-delayed refreshment signal, which has not passed through the delay part, is to be output in accordance with the type data.

* * * * *